(12) United States Patent
Kim et al.

(10) Patent No.: US 12,310,151 B2
(45) Date of Patent: May 20, 2025

(54) DISPLAY DEVICE

(71) Applicant: Samsung Display Co., LTD., Yongin-si (KR)

(72) Inventors: Su Jeong Kim, Seoul (KR); Dae Won Kim, Hwaseong-si (KR); Jong Ho Son, Seoul (KR); Jin Hyeong Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 409 days.

(21) Appl. No.: 17/723,763

(22) Filed: Apr. 19, 2022

(65) Prior Publication Data

US 2022/0393068 A1 Dec. 8, 2022

(30) Foreign Application Priority Data

Jun. 8, 2021 (KR) .................. 10-2021-0074260

(51) Int. Cl.
*H01L 27/15* (2006.01)
*H01L 25/075* (2006.01)
*H01L 31/12* (2006.01)
*H10H 20/814* (2025.01)
*H10H 20/831* (2025.01)
*H10H 20/832* (2025.01)
*H10H 20/854* (2025.01)

(52) U.S. Cl.
CPC ..... *H10H 20/8312* (2025.01); *H01L 25/0753* (2013.01); *H10H 20/814* (2025.01); *H10H 20/835* (2025.01); *H10H 20/854* (2025.01)

(58) Field of Classification Search
CPC ... H01L 33/382; H01L 25/0753; H01L 33/10; H01L 33/405; H01L 33/56; H01L 33/60; H01L 2933/0091; H01L 33/58; H01L 27/156; H01L 33/483
USPC .......................................... 257/79
See application file for complete search history.

(56) References Cited

U.S. PATENT DOCUMENTS

| | | |
|---|---|---|
| 11,004,892 B2 | 5/2021 | Kim et al. |
| 11,469,287 B2 | 10/2022 | Lee et al. |
| 11,682,693 B2 | 6/2023 | Kim et al. |
| 2020/0043976 A1* | 2/2020 | Kim ............. H01L 33/504 |
| 2022/0149111 A1 | 5/2022 | Lee et al. |
| 2022/0209071 A1 | 6/2022 | Kim et al. |
| 2023/0016966 A1 | 1/2023 | Lee et al. |

FOREIGN PATENT DOCUMENTS

| | | |
|---|---|---|
| JP | 4826806 | 11/2011 |
| KR | 10-2019-0115160 | 10/2019 |
| KR | 10-2020-0016424 | 2/2020 |

(Continued)

*Primary Examiner* — Theresa T Doan
(74) *Attorney, Agent, or Firm* — KILE PARK REED & HOUTTEMAN PLLC

(57) ABSTRACT

A display device comprises a first and a second electrode disposed on a base substrate and spaced apart from each other, the second electrode facing the first electrode, a light emitting elements disposed between the first electrode and the second electrode, and a light structure disposed on the light emitting elements. The light structure includes a light transmitting portion disposed on the light emitting element, and a light shielding portion including at least one opening pattern. The light shielding portion is disposed on the light transmitting portion.

20 Claims, 16 Drawing Sheets

(56) References Cited

FOREIGN PATENT DOCUMENTS

| KR | 10-2020-0063386 | 6/2020 |
|----|-----------------|--------|
| KR | 10-2020-0140966 | 12/2020 |
| KR | 10-2022-0097699 | 7/2022 |

\* cited by examiner

DISPLAY DEVICE

CROSS-REFERENCE TO RELATED APPLICATION(S)

This application claims priority to and the benefits of Korean Patent Application No. 10-2021-0074260 under 35 U.S.C. § 119, filed on Jun. 8, 2021, in the Korean Intellectual Property Office, the entire contents of which are incorporated herein by reference.

BACKGROUND

1. Technical Field

The disclosure relates to a display device.

2. Description of the Related Art

With the advancement of the information age, the demand for a display device for displaying an image has increased in many ways. For example, display devices have been applied to various electronic devices such as smart phones, digital cameras, notebook computers, navigators and smart televisions. The display device may be a flat panel display device such as a liquid crystal display device, a field emission display device or an organic light emitting display device. Among flat panel display devices, light emitting display devices include light emitting element in which each of the pixels of a display panel may be self-emissive of light, and thereby display an image even without a backlight unit that provides light to the display panel.

SUMMARY

An object of the disclosure is to provide a display device in which external light reflection is improved, and light emission efficiency is improved.

The objects of the disclosure are not limited to those mentioned above and additional objects of the disclosure, which are not mentioned herein, will be clearly understood by those skilled in the art from the following description of the disclosure.

A display device according to an embodiment may comprise a first electrode and a second electrode disposed on a base substrate and spaced apart from each other, the second electrode facing the first electrode; light emitting elements disposed between the first electrode and the second electrode; and a light structure disposed on the light emitting elements. The light structure may include a light transmitting portion disposed on the light emitting element, and a light shielding portion provided with at least one opening pattern on the light transmitting portion.

In an embodiment, the light transmitting portion may include a base resin and a scatterer dispersed in the base resin. The scatterer may have a refractive index different from a refractive index of the base resin.

In an embodiment, the scatterer may include light scattering particles.

In an embodiment, a content of the light scattering particles in the light transmitting portion may be in a range of about 2% to about 3%.

In an embodiment, the light scattering particles may include titanium oxide (TiO2) or silicon oxide (SiO2).

In an embodiment, the light transmitting portion may be disposed on each of the light emitting elements.

In an embodiment, the display device may further comprise banks that are spaced apart from each other and disposed on the base substrate. The first electrode and the second electrode may be disposed on the banks and may be spaced apart from each other.

In an embodiment, the display device may further comprise a first insulating layer disposed on the first electrode and the second electrode between the banks. The light emitting elements may be disposed on the first insulating layer.

In an embodiment, the display device may further comprise a contact electrode disposed on the first insulating layer, and electrically contacting the light emitting elements. The contact electrode may include a first contact electrode that electrically contacts the first electrode and an end of at least one of the light emitting elements, and a second contact electrode that electrically contacts the second electrode and another end of the at least one of the light emitting elements.

In an embodiment, the light transmitting portion may directly contact the contact electrode.

In an embodiment, the light structure may further include a reflective portion disposed between the light shielding portion and the light transmitting portion.

In an embodiment, the reflective portion may include at least one opening pattern.

In an embodiment, the at least one opening pattern of the reflective portion and the at least one opening pattern of the light shielding portion may be formed at the same time.

In an embodiment, the reflective portion, the first electrode, and the second electrode may include a reflective electrode.

In an embodiment, the at least one opening pattern of the light shielding portion and the at least one opening pattern of the reflective portion may overlap the light transmitting portion in a thickness direction of the display device.

In an embodiment, at least one of the light emitting elements may overlap the at least one opening pattern of the light shielding portion in a thickness direction of the display device.

In an embodiment, the light shielding portion may include at least one of chromium oxide (CrOx), chromium-chromium oxide (Cr/CrOx) compound, molybdenum oxide (MoOx), a carbon pigment and a Red-Green-Blue (RGB) primary color pigment.

A display device according to an embodiment may comprise a first electrode and a second electrode disposed on a base substrate and spaced apart from each other, the second electrode facing the first electrode; light emitting elements disposed between the first electrode and the second electrode and emitting light; a light transmitting portion disposed on the light emitting element; a light shielding portion disposed on the light transmitting portion; and a reflective portion disposed between the light transmitting portion and the light shielding portion. The light transmitting portion may include a base resin and a scatterer dispersed in the base resin. The scatterer may include light scattering particles. At least one opening pattern may pass through the light shielding portion and the reflective portion, and is formed in the light shielding portion and the reflective portion. The light emitting elements may emit light through the at least one opening pattern. A size of an area in a plan view from which the light is emitted is smaller than a size of an area in a plan view of the light transmitting portion.

In an embodiment, the reflective portion, the first electrode, and the second electrode may include a reflective electrode. The reflective portion, the first electrode, and the second electrode may reflect the light emitted from the light emitting elements.

In an embodiment, the light scattering particles scatter the light emitted from the light emitting elements.

Details of the other embodiments are included in the detailed description and drawings.

In the display device according to the embodiments, external light reflection and light emission efficiency may be improved.

The effects according to the embodiments of the disclosure are not limited to those mentioned above and more various effects are included in the following description of the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
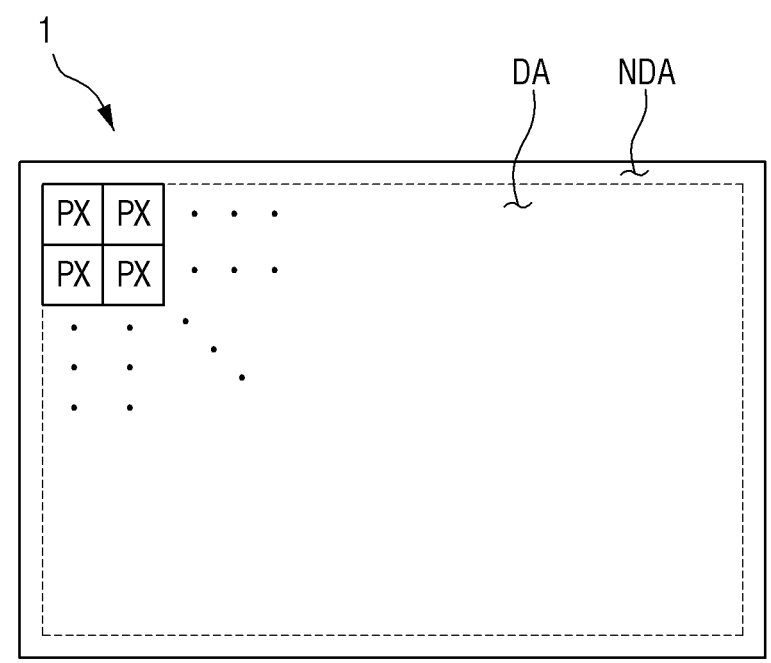
FIG. 1 is a schematic plan view illustrating a display device according to one embodiment of the disclosure.
Figure 1:
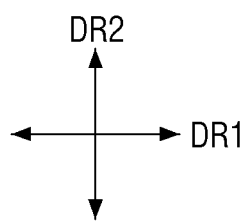

Specific structural and functional descriptions of embodiments disclosed herein are only for illustrative purposes of the embodiments. The disclosure may be embodied in many different forms without departing from the spirit and significant characteristics of the embodiments. Therefore, the embodiments are disclosed only for illustrative purposes and should not be construed as limiting the embodiments. The embodiments are only defined by the scope of the claims.

It will be understood that when an element is referred to as being related to another element such as being "coupled," "contacting," or "connected" to another element, it can be directly coupled, contacting, or connected to the other element or intervening elements may be present therebetween. In contrast, it should be understood that when an element is referred to as being related to another element such as being "directly coupled," "directly contacting," or "directly connected" to another element, there are no intervening elements present. Other expressions that explain relationships between elements, such as "disposed on," "disposed directly on," "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments will be described with reference to the attached drawings.

FIG. 1 is a schematic plan view illustrating a display device according to one embodiment of the disclosure.

Referring to FIG. 1, the display device 1 may have a rectangular planar shape but is not limited thereto. The planar shape of the display device 1 may be a square shape, a circular shape, an oval shape or other polygonal shapes. Hereinafter, the description will be based on that a rectangular shape is applied to the planar shape of the display device 1. The display device 1 having a rectangular planar shape may include long sides extended along a first direction DR1 and short sides extended along a second direction DR2. A corner where the long side and the short side of the display device 1 meet each other may be angled as illustrated in FIG. 1, but may also be rounded without being limited thereto.

The display device 1 may include a display area DA and a non-display area NDA. The display area DA may include pixels PX to display an image. The pixels PX may be arranged in a matrix manner. The non-display area NDA may be disposed in the vicinity of the display area DA to surround the display area DA, and may not display an image. The non-display area NDA may fully surround the display area DA on a plane.

Figure 2:
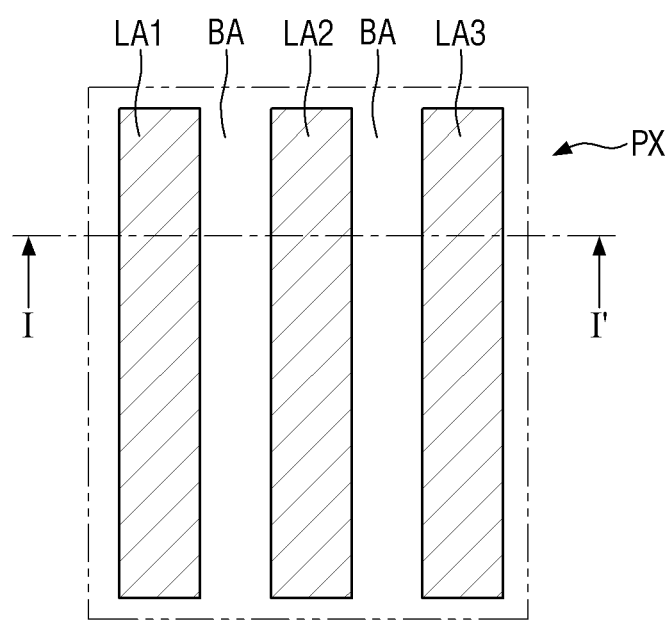
FIG. 2 is an enlarged schematic plan view illustrating one subpixel of FIG. 1.

FIG. 2 is an enlarged schematic plan view illustrating a subpixel of FIG. 1.

Referring to FIG. 2, each of the pixels PX of the display device 1 may include light emission areas LA1, LA2 and LA3 defined by a pixel defining layer, and may emit light having a selected peak wavelength through the light emission areas LA1, LA2 and LA3. For example, the display area DA of the display device may include first to third light emission areas LA1, LA2 and LA3. Each of the first to third light emission areas LA1, LA2 and LA3 may be an area through which light generated from a light emitting element of the display device is emitted to the outside of the display device.

The first to third light emission areas LA1, LA2 and LA3 may emit light having a selected peak wavelength to the outside of the display device. The first light emission area LA1 may emit light of a first color, the second light emission area LA2 may emit light of a second color, and the third light emission area LA3 may emit light of a third color. For example, the light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm, but the embodiments are not limited thereto.

The display area DA of the display device 1 may include a light shielding area BA positioned between adjacent light emission areas LA1, LA2 and LA3. For example, the light shielding area BA may surround the first light emission area LA1 to the third light emission area LA3.

Figure 3:
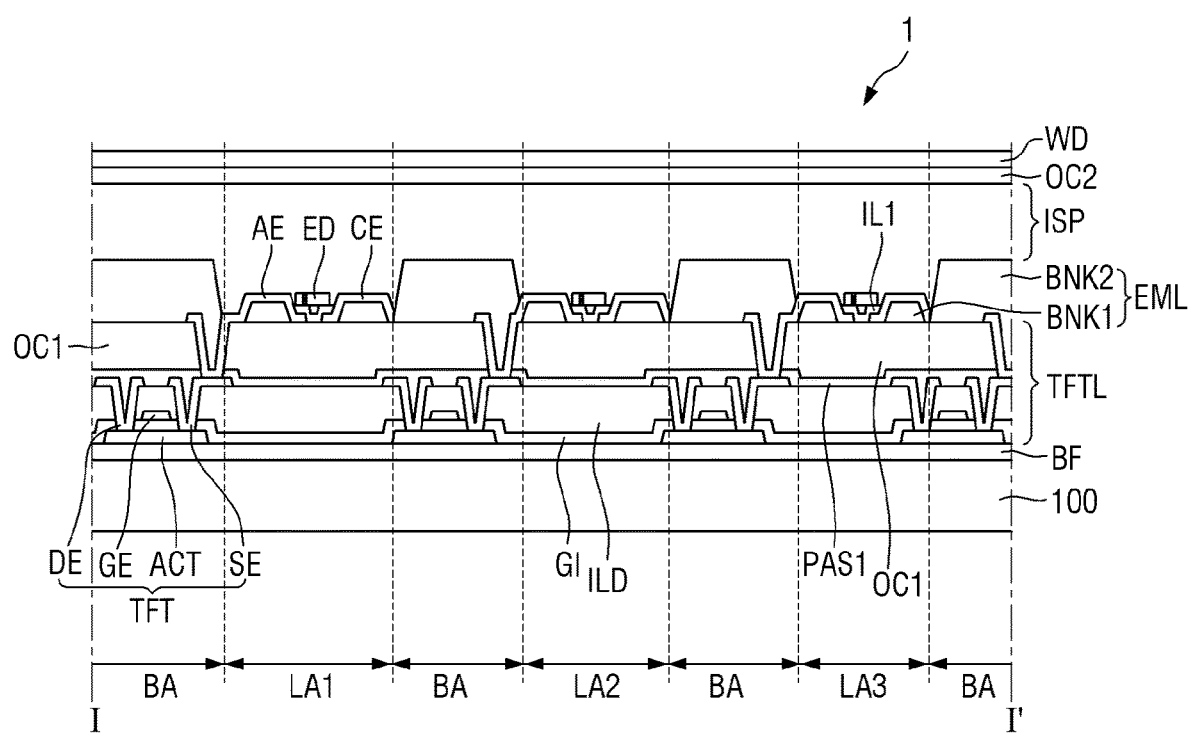
FIG. 3 is a schematic cross-sectional view taken along line I-I' of FIG. 2.

FIG. 3 is a cross-sectional view taken along a line I-I' of FIG. 2.

Referring to FIGS. 1 to 3, the display device 1 may include a substrate 100, a buffer layer BF, a thin film transistor layer TFTL, and a light emitting element layer EML.

The substrate 100 may be a base substrate or a base member, and may be made of an insulating material such as a polymer resin. For example, the substrate 100 may be a rigid substrate. For example, the substrate 100 may include glass, quartz or the like.

The buffer layer BF may be disposed on the substrate 100. The buffer layer BF may be made of an inorganic layer capable of preventing the permeation of the air or moisture.

The thin film transistor layer TFTL may include a thin film transistor TFT, a gate insulating layer GI, an interlayer dielectric layer ILD, a first passivation layer PAS1 and a first planarization layer OC1.

The thin film transistor TFT may be disposed on the buffer layer BF, and may constitute a pixel circuit of each of the pixels.

A semiconductor layer ACT may be formed on the buffer layer BF. The semiconductor layer ACT may overlap a gate electrode GE, a source electrode SE and a drain electrode DE. The semiconductor layer ACT may directly be in contact with the source electrode SE and the drain electrode DE, and may face the gate electrode GE with the gate insulating layer GI interposed therebetween.

The gate electrode GE may be disposed on the gate insulating layer GI. The gate electrode GE may overlap the semiconductor layer ACT with the gate insulating layer GI interposed therebetween.

The source electrode SE and the drain electrode DE may be disposed to be spaced apart from each other on the interlayer dielectric layer ILD. The source electrode SE may be in contact with one end of the semiconductor layer ACT through a contact hole provided in the gate insulating layer GI and the interlayer dielectric layer ILD. The drain electrode DE may be in contact with the other end of the semiconductor layer ACT through the contact hole provided in the gate insulating layer GI and the interlayer dielectric layer ILD. The drain electrode DE may be connected with a first electrode AE of the light emitting member EL through a contact hole provided in the first passivation layer PAS1 and the first planarization layer OC1.

The gate insulating layer GI may be formed on the semiconductor layer ACT. For example, the gate insulating layer GI may be disposed on the semiconductor layer ACT and the buffer layer BF, and may insulate the semiconductor layer ACT from the gate electrode GE. The gate insulating layer GI may include a contact hole through which the source electrode SE passes and a contact hole through which the drain electrode DE passes.

The interlayer dielectric layer ILD may be disposed on the gate electrode GE. For example, the interlayer dielectric layer ILD may include a contact hole through which the source electrode SE passes and a contact hole through which the drain electrode DE passes.

The first passivation layer PAS1 may be provided on the thin film transistor TFT to protect the thin film transistor TFT. For example, the first passivation layer PAS1 may include a contact hole through which the first electrode AE passes.

The first planarization layer OC1 may be provided on an upper portion of the first passivation layer PAS1 to planarize an upper end of the thin film transistor TFT. For example, the first planarization layer OC1 may include a contact hole through which the first electrode AE of the light emitting member EL passes.

The light emitting element layer EML may include a light emitting member EL, a first bank BNK1, a second bank BNK2 and a second passivation layer PAS2.

The light emitting member EL may be provided on the thin film transistor TFT. The light emitting member EL may include a first electrode AE, a second electrode CE and a light emitting element ED.

The first electrode AE may be provided on an upper portion of the first planarization layer OC1. For example, the first electrode AE may be disposed on the first bank BNK1 disposed on the first planarization layer OC1 to cover the first bank BNK1. The first electrode AE may be disposed to overlap one of the first to third light emission areas LA1, LA2 and LA3 defined by the second bank BNK2. The first electrode AE may be connected to the drain electrode DE of the thin film transistor TFT.

The second electrode CE may be formed on the upper portion of the first planarization layer OC1. For example, the second electrode CE may be disposed on the first bank BNK1 disposed on the first planarization layer OC1 to cover the first bank BNK1. The second electrode CE may be disposed to overlap one of the first to third light emission areas LA1, LA2 and LA3 defined by the second bank BNK2. For example, the second electrode CE may receive a common voltage supplied to all the pixels.

In an embodiment, the first electrode AE and the second electrode CE may include a reflective electrode. The reflective electrode may include a conductive material having high reflectance. The conductive material having high reflectance may include, but is not limited to, aluminum (Al) or silver (Ag).

A first insulating layer IL1 may cover a portion of the first electrode AE and a portion of the second electrode CE, which are adjacent to each other, and may insulate the first electrode AE from the second electrode CE.

The light emitting element ED may be disposed between the first electrode AE and the second electrode CE at the upper portion of the first planarization layer OC1. The light emitting element ED may be disposed on the first insulating layer IL1. An end of the light emitting element ED may be connected to the first electrode AE, and the other end of the light emitting element ED may be connected to the second electrode CE.

For example, the light emitting elements ED may include active layers having the same material to emit light of the same wavelength band or light of the same color. The light emitted from each of the first to third light emission areas LA1, LA2 and LA3 may have the same color. For example, the light emitting elements ED may emit blue light or light of a third color having a peak wavelength in the range of about 440 nm to about 480 nm.

The second bank BNK2 may be disposed on the first planarization layer OC1 to define the first to third light emission areas LA1, LA2 and LA3. For example, the second bank BNK2 may surround each of the first to third light emission areas LA1, LA2 and LA3, but is not limited thereto. The second bank BNK2 may be disposed in the light shielding area BA.

The display device may further include a light structure ISP, an upper planarization layer OC2 and a window WD.

The light structure ISP may be disposed on the first electrode AE, the second electrode CE, the light emitting element ED and the second bank BNK2.

The light structure ISP may include a light transmitting portion, a reflective portion, and a light shielding portion. A detailed structure of the light structure ISP will be described later.

An upper planarization layer OC2 may be disposed on the light structure ISP.

The upper planarization layer OC2 may be provided on an upper portion of the light structure ISP to planarize an upper end of the light structure ISP. Without limitation to this example, the upper planarization layer OC2 may serve to attach the window WD disposed above the light structure ISP to the light structure ISP.

The window WD may be disposed on the upper planarization layer OC2. The window WD may be provided in the form of a thin glass or thin film. Since the light generated from the light emitting element layer EML is emitted to the outside through the window WD, the light transmittance of the window WD may be very high. Therefore, the window WD may be provided as a transparent window.

Figure 4:
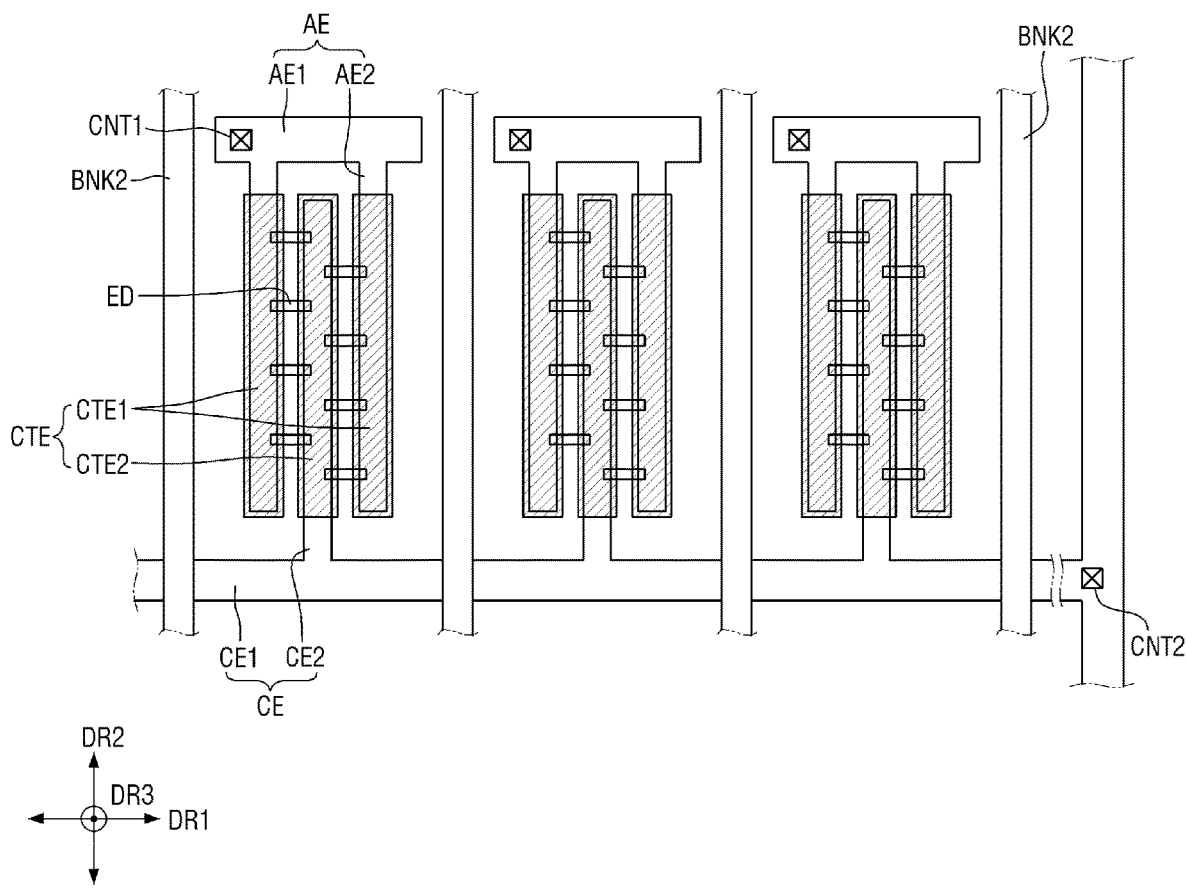
FIG. 4 is a schematic plan view illustrating one pixel of a display device according to one embodiment of the disclosure.
Figure 5:
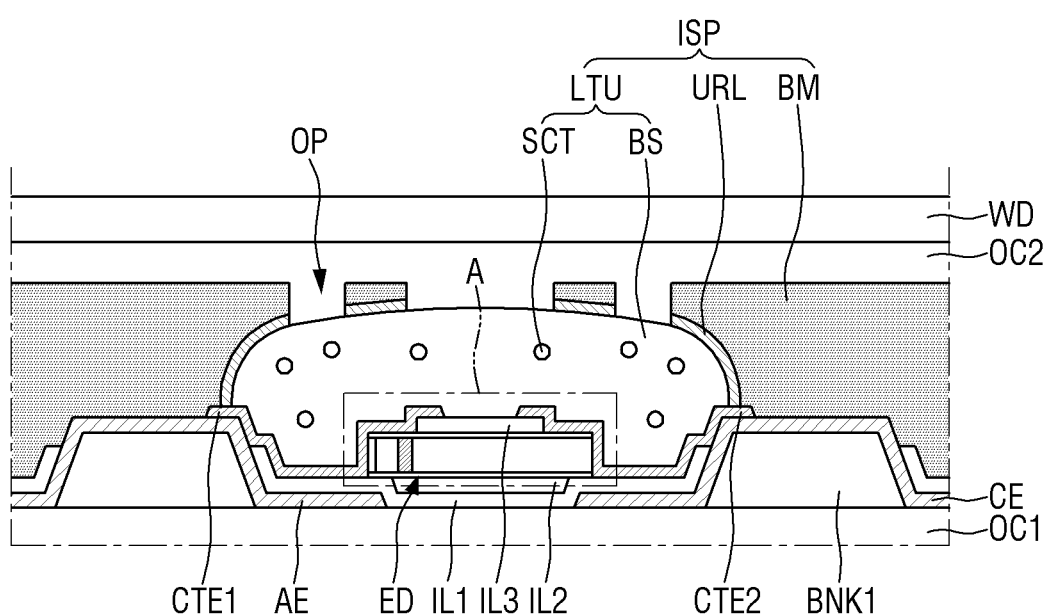
FIG. 5 is a schematic detailed sectional view illustrating a light structure of FIG. 3.
Figure 6:
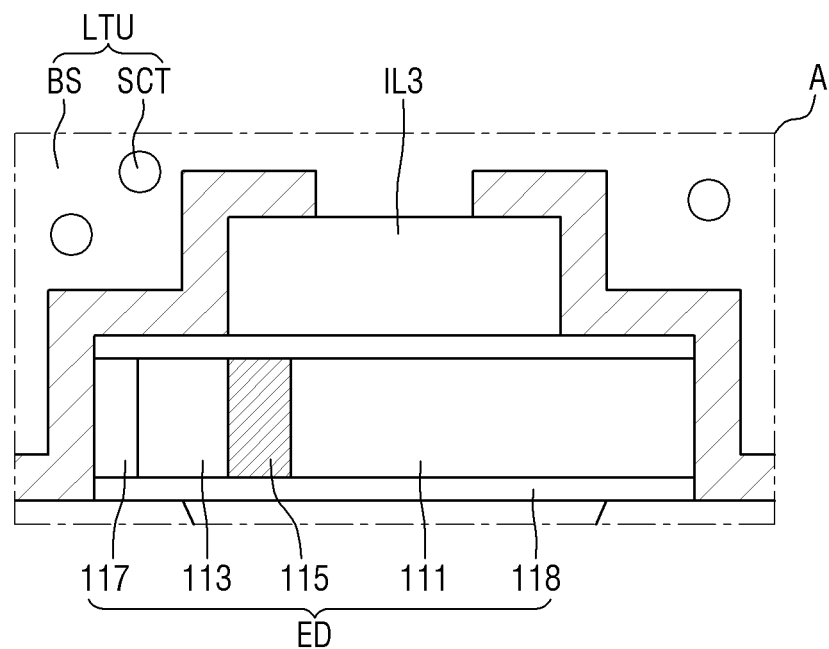
FIG. 6 is an enlarged schematic sectional view illustrating an area A of FIG. 5.

FIG. 4 is a schematic plan view illustrating a pixel of a display device according to an embodiment of the disclosure. FIG. 5 is a detailed schematic sectional view illustrating the light structure of FIG. 3. FIG. 6 is an enlarged sectional view illustrating an area A of FIG. 5.

Referring to FIGS. 4 to 6 together with FIG. 3, each of the pixels may include first to third subpixels. The first to third subpixels may respectively correspond to the first to third light emission areas LA1, LA2 and LA3. The light emitting elements ED of the first to third subpixels may emit light through the first to third light emission areas LA1, LA2 and LA3.

The first to third subpixels may respectively emit light of the same color. For example, the first to third subpixels may respectively include the same type of light emitting element ED, and may emit light of a third color or blue light. For example, the first subpixel may emit light of a first color or red light, the second subpixel may emit light of a second color or green light, and the third subpixel may emit light of a third color or blue light.

Each of the first to third subpixels may include first and second electrodes AE and CE, a light emitting element ED, contact electrodes CTE, and second banks BNK2.

The first and second electrodes AE and CE may electrically be connected with the light emitting element ED to receive a selected voltage, and the light emitting element ED may emit light of a specific wavelength band. At least a portion of the first and second electrodes AE and CE may form an electric field in the pixel, and the light emitting element ED may be aligned by the electric field.

For example, the first electrode AE may be a pixel electrode separated for each of the first to third subpixels, and the second electrode CE may be a common electrode commonly connected to the first to third subpixels. One of the first electrode AE or the second electrode CE may be an anode electrode of the light emitting element ED, and the other electrode may be a cathode electrode of the light emitting element ED.

The first electrode AE may include a first electrode stem portion AE1 extended in the first direction DR1 and at least one first electrode branch portion AE2 diverged from the first electrode stem portion AE1 and extended in the second direction DR2.

The first electrode stem portion AE1 of each of the first to third subpixels may be spaced apart from the first electrode stem portion AE1 of another adjacent subpixel, and the first electrode stem portion AE1 may be disposed on a virtual extension line with the first electrode stem portion AE1 of another subpixel adjacent thereto in the first direction DR1. The first electrode stem portions AE1 of the first to third subpixels may receive their respective signals different from one another, and may independently be driven.

The first electrode branch portion AE2 may be diverged from the first electrode stem portion AE1 and extended in the second direction DR2. One end of the first electrode branch portion AE2 may be connected to the first electrode stem portion AE1, and the other end of the first electrode branch portion AE2 may be spaced apart from a second electrode stem portion CE1 opposite to the first electrode stem portion AE1.

The second electrode CE may include a second electrode stem portion CE1 extended in the first direction DR1 and a second electrode branch portion CE2 diverged from the second electrode stem portion CE1 and extended in the second direction DR2. The second electrode stem portion CE1 of each of the first to third subpixels may be connected to the second electrode stem portion CE1 of another adjacent subpixel. The second electrode stem portion CE1 may be extended in the first direction DR1 to cross the plurality of pixels. The second electrode stem portion CE1 may be connected to an outer portion of the display area DA, or a portion extended from the non-display area NDA in one direction.

The second electrode branch portion CE2 may be spaced apart from the first electrode branch portion AE2 to face the first electrode branch portion AE2. One end of the second electrode branch portion CE2 may be connected to the second electrode stem portion CE1 and the other end of the second electrode branch portion CE2 may be spaced apart from the first electrode stem portion AE1.

The first electrode AE may electrically be connected with the thin film transistor layer TFTL of the display device through a first contact hole CNT1, and the second electrode CE may electrically be connected with the thin film transistor layer TFTL of the display device through the second contact hole CNT2. For example, the first contact hole CNT1 may be disposed on each of the first electrode stem portions AE1 and the second contact hole CNT2 may be disposed on the second electrode stem portion CE1, but the embodiments are not limited thereto.

The second bank BNK2 may be disposed at a boundary between the pixels. The first electrode stem portions AE1 may be spaced apart from each other based on the second bank BNK2. The second bank BNK2 may be extended in the second direction DR2, and may be disposed at the boundary of the pixels arranged in the first direction DR1. The second bank BNK2 may be disposed at the boundary of the pixels arranged in the second direction DR2. The second bank BNK2 may define the boundary of the pixels.

When ink in which light emitting element ED are dispersed is sprayed during the manufacturing process of the display device, the second bank BNK2 may prevent the ink from overflowing the boundary of the pixels. The second bank BNK2 may separate the different light emitting elements ED from each other so that the ink that is sprayed may not be mixed with each other.

The light emitting element ED may be disposed between the first electrode AE and the second electrode CE. An end of the light emitting element ED may be connected to the first electrode AE, and the other end thereof may be connected to the second electrode CE.

The light emitting elements ED may be disposed to be spaced apart from each other, and may substantially be aligned to be parallel with each other. There is no special limitation in spacing between the light emitting elements ED.

The light emitting elements ED may include active layers having the same material, and may emit light of the same wavelength band or light of the same color. The first to third subpixels emit light of the same color. For example, the light emitting elements ED may emit blue light or light of a third color having a peak wavelength in the range of about 440 nm to about 480 nm.

The contact electrode CTE may include first and second contact electrodes CTE1 and CTE2. The first contact electrode CTE1 may cover a portion of the first electrode branch portion AE2 and the light emitting element ED, and may electrically connect the first electrode branch portion AE2 with the light emitting element ED. The second contact electrode CTE2 may cover another portion of the second electrode branch portion CE2 and the light emitting element ED, and may electrically connect the second electrode branch portion CE2 with the light emitting element ED.

The first contact electrode CTE1 may be disposed on the first electrode branch portion AE2 and extend in the second direction DR2. The first contact electrode CTE1 may be in contact with an end of the light emitting element ED. The light emitting element ED may be electrically connected with the first electrode AE through the first contact electrode CTE1.

The second contact electrode CTE2 may be disposed on the second electrode branch portion CE2 and extended in the second direction DR2. The second contact electrode CTE2 may be spaced apart from the first contact electrode CTE1 in the first direction DR1. The second contact electrode CTE2 may be in contact with the other end of the light emitting element ED. The light emitting element ED may be electrically connected with the second electrode CE through the second contact electrode CTE2.

The light emitting element layer EML of the display device may be disposed on the thin film transistor layer TFTL, and may include first to third insulating layers IL1, IL2 and IL3.

The first banks BNK1 may be disposed in the first to third light emission areas LA1, LA2 and LA3, respectively. Each of the first banks BNK1 may correspond to the first electrode AE or the second electrode CE. Each of the first and second electrodes AE and CE may be disposed on the first bank BNK1 corresponding thereto.

The first banks BNK1 may be disposed on the first planarization layer OC1, and sides of each of the first banks BNK1 may be inclined from the first planarization layer OC1. The inclined surface of the first bank BNK1 may reflect the light emitted from the light emitting element ED.

The first electrode stem portion AE1 may include a first contact hole CNT1 passing through the first planarization layer OC1. The first electrode stem portion AE1 may electrically be connected with the thin film transistor TFT via the first contact hole CNT1.

The second electrode stem portion CE1 may be extended in the first direction DR1, and may also be disposed in a non-light emission area where the light emitting element ED is not disposed. The second electrode stem portion CE1 may include a second contact hole CNT2 passing through the first planarization layer OC1. The second electrode stem portion CE1 may electrically be connected with a power electrode through the second contact hole CNT2. The second electrode CE may receive a selected electrical signal from the power electrode.

The first and second electrodes AE and CE may include a transparent conductive material. The first and second electrodes AE and CE may include a conductive material having high reflectance. Each of the first and second electrodes AE and CE may have a structure including a transparent conductive material and a metal having high reflectance deposited to form more than one layer, or may be formed as a single layer that includes a transparent conductive material and a metal having high reflectance.

The first insulating layer IL1 may be disposed on the first planarization layer OC1, the first electrode AE and the second electrode CE. The first insulating layer IL1 may cover a portion of each of the first and second electrodes AE and CE.

The first insulating layer IL1 may protect the first and second electrodes AE and CE, and may insulate the first and second electrodes AE and CE from each other. The first insulating layer IL1 may prevent the light emitting element ED from being damaged due to direct contact with other members.

The light emitting element ED may be disposed between the first electrode AE and the second electrode CE on the first and second insulating layers IL1 and IL2. An end of the light emitting element ED may be connected to the first electrode AE, and the other end of the light emitting element ED may be connected to the second electrode CE.

The third insulating layer IL3 may partially be disposed on the light emitting element ED disposed between the first and second electrodes AE and CE. The third insulating layer IL3 may partially surround an outer surface of the light emitting element ED. The third insulating layer IL3 may protect the light emitting element ED. The third insulating layer IL3 may surround the outer surface of the light emitting element ED.

The contact electrode CTE may include first and second contact electrodes CTE1 and CTE2. The first contact electrode CTE1 may cover a portion of the first electrode branch portion AE2 and the light emitting element ED, and may electrically connect the first electrode branch portion AE2 with the light emitting element ED. The second contact electrode CTE2 may cover another portion of the second electrode branch portion CE2 and the light emitting element ED, and may electrically connect the second electrode branch portion CE2 with the light emitting element ED.

The first contact electrode CTE1 may be disposed on the first electrode branch portion AE2 and extended in the second direction DR2. The first contact electrode CTE1 may contact an end of the light emitting element ED. The light emitting element ED may be electrically connected with the first electrode AE through the first contact electrode CTE1.

The second contact electrode CTE2 may be disposed on the second electrode branch portion CE2 and extended in the second direction DR2. The second contact electrode CTE2 may be spaced apart from the first contact electrode CTE1 in the first direction DR1. The second contact electrode CTE2 may contact the other end of the light emitting element ED. The light emitting element ED may be electrically connected with the second electrode CE through the second contact electrode CTE2.

The contact electrodes CTE1 and CTE2 may include a conductive material. The light structure ISP may include a light transmitting portion LTU disposed on the light emitting element ED and a light shielding portion BM including at least one opening pattern OP disposed on the light transmitting portion LTU.

The light transmitting portion LTU may include a base resin BS and a scatterer SCT. The base resin BS may include a material having relatively high light transmittance. The base resin BS may be made of a transparent organic material. For example, the base resin BS may include at least one of organic materials such as an epoxy-based resin, an acrylic resin, a cardo-based resin, and an imide-based resin. The refractive index of the scatterer SCT may be different from the refractive index of the base resin BS, and may form an optical interface with the base resin BS. For example, the scatterer SCT may include a light scattering material or light scattering particles that scatter at least a portion of the transmitted light. The light scattering particles, or the light scattering material may scatter the emitted light. The content of the light scattering particles in the light transmitting portion LTU may be in a range of about 2% to about 3%.

When the content of the light scattering particles in the light transmitting portion LTU is about 2% or more, the emitted light (light emitted from the light emitting element ED) in the light transmitting portion LTU may significantly be scattered (having a significant scattering rate). Even though the content of the light scattering particles in the light transmitting portion LTU is about 3% or more, the scattering rate may not be increased substantially. When the content of the light scattering particles in the light transmitting portion LTU is about 3% or less, it is possible to reduce costs while having a sufficient scattering rate, as described above. The light scattering particles may include, but are not limited to, titanium oxide ($TiO_2$) or silicon oxide ($SiO_2$).

The light transmitting portion LTU, which includes a base resin BS and a scatterer SCT, may be disposed on the light emitting elements ED. In an embodiment, as shown in FIG. 5, the light transmitting portion LTU may contact (for example, directly contact) the contact electrodes CTE1 and CTE2. The light transmitting portion LTU may contact (for example, directly contact) the upper surface exposed by the contact electrodes CTE1 and CTE2 of the light emitting element ED.

The light structure ISP may further include a reflective portion URL disposed between the light shielding portion BM and the light transmitting portion LTU. In the same manner as the first and second electrodes AE and CE, the reflective portion URL may include a reflective electrode. For example, the reflective portion URL may include, but is not limited to, aluminum(Al) or silver(Ag).

The light shielding portion BM may include at least one of chromium oxide (CrOx), a chromium-chromium oxide (Cr/CrOx) mixture (or compound), molybdenum oxide (MoOx), a carbon pigment, and a Red-Green-Blue (RGB) primary color pigment.

The reflective portion URL may include at least one opening pattern OP. As shown in FIG. 5, the opening pattern of the light shielding portion BM and the opening pattern of the reflective portion URL may overlap each other in a thickness direction. The opening pattern of the light shielding portion BM and the opening pattern of the reflective portion URL may be formed at the same time. Hereinafter, each of the opening pattern of the light shielding portion BM and the opening pattern of the reflective portion URL will be referred to as the opening pattern OP of the light structure ISP for convenience of description. There may be multiple opening patterns OP of the light structure ISP. The opening pattern OP may overlap the light transmitting portion LTU in the thickness direction. Furthermore, at least one of the light emitting elements ED may be disposed to overlap the opening pattern OP.

The light structure ISP according to an embodiment may have substantially the shape of an integrating sphere. In the disclosure, tan integrating sphere means a sphere fully coated with a material having high reflectance on the inside. The light structure ISP according to an embodiment substantially has an integrating sphere shape because the reflective portion URL fully covers the inner surface of the light transmitting portion LTU and at least one opening pattern OP is formed in the reflective portion URL. The shape formed by the light transmitting portion LTU may be a substantially similar to a sphere, although it is not a complete sphere. Functionally, the reflective portion URL disposed on the surface of the light transmitting portion LTU may reflect a portion of first light L1 and/or a portion of second light L2, which is scattered by the scatterer SCT of the first light L1, in a manner similar to an integrating sphere.

Figure 10:
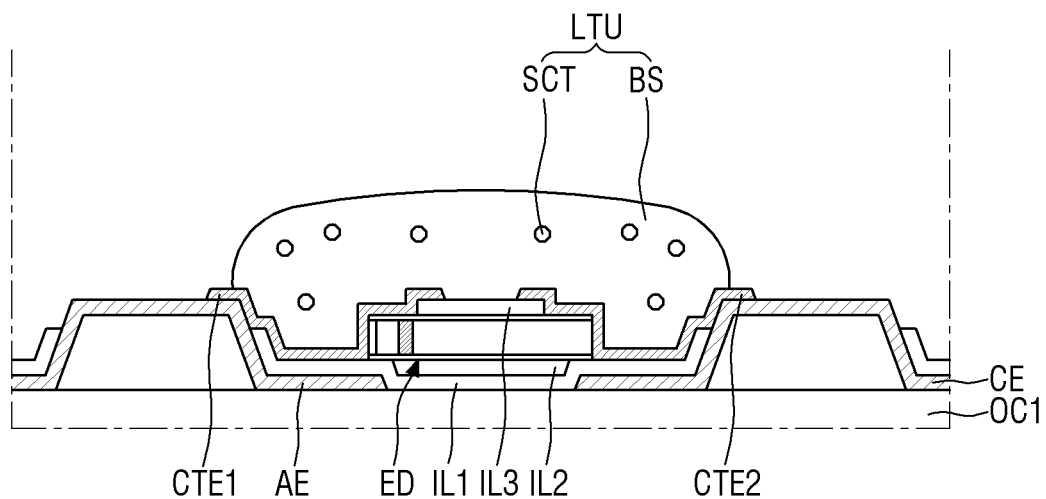
FIGS. 10 to 12 are schematic cross-sectional views illustrating that a light structure according to one embodiment is formed.
Figure 11:
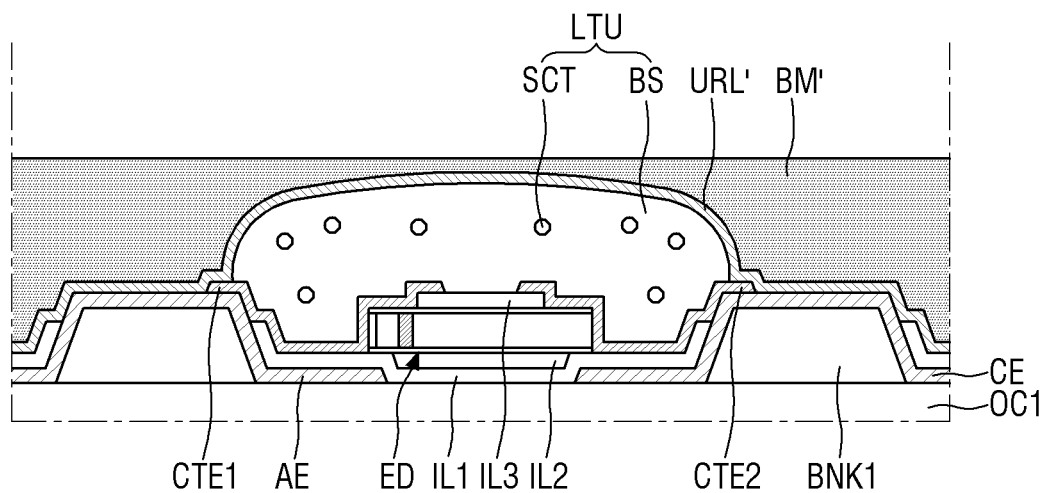
Figure 12:
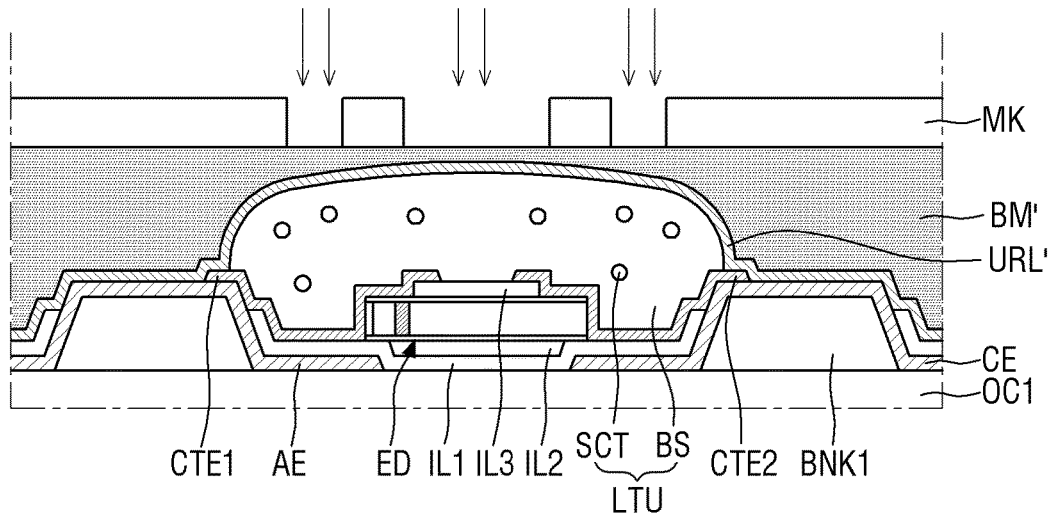

FIGS. 10 to 12 are sectional views illustrating how a light structure according to an embodiment is formed.

As shown in FIG. 10, the light transmitting portion LTU on the light emitting element ED may be patterned through a photolithography process. The patterned light transmitting portion LTU may be disposed for each of the light emitting elements ED.

Subsequently, as shown in FIG. 11, a reflective portion material URL' is fully formed on the patterned light transmitting portion LTU and then a light shielding portion material BM' may fully be formed on the reflective portion material URL'. The reflective portion material URL' includes a reflective electrode material, and the reflective electrode material may include, but is not limited to, aluminum (Al) or silver (Ag). The light shielding portion material BM' may include at least one of chromium oxide (CrOx), a chromium-chromium oxide (Cr/CrOx) mixture (or compound), molybdenum oxide (MoOx), a carbon pigment, and a Red-Green-Blue (RGB) primary color pigment.

As shown in FIG. 12, a mask MK is disposed on the light shielding portion material BM' after the light shielding portion material BM' is formed. In the step of disposing the mask MK, the mask MK is disposed on the light shielding portion material BM', and is disposed so as not to overlap the opening pattern OP shown in FIG. 5. The mask MK is disposed so that an open portion of the mask MK overlaps the opening pattern OP shown in FIG. 5. Light is irradiated (exposed) through the open portion of the mask MK. In the exposure step, the light is irradiated onto a portion (corresponding to the opening pattern OP of FIG. 5) of each of the light shielding portion material BM' and the reflective portion material URL' through the open portion of the mask MK. Subsequently, the portion (corresponding to the opening pattern OP of FIG. 5) of each of the light shielding portion material BM' and the reflective portion material URL', onto which the light is irradiated, are developed. As a result, the light structure ISP shown in FIG. 5 (including opening patterns OP of the light shielding portion material BM and the reflective portion material URL) is formed.

Figure 8:
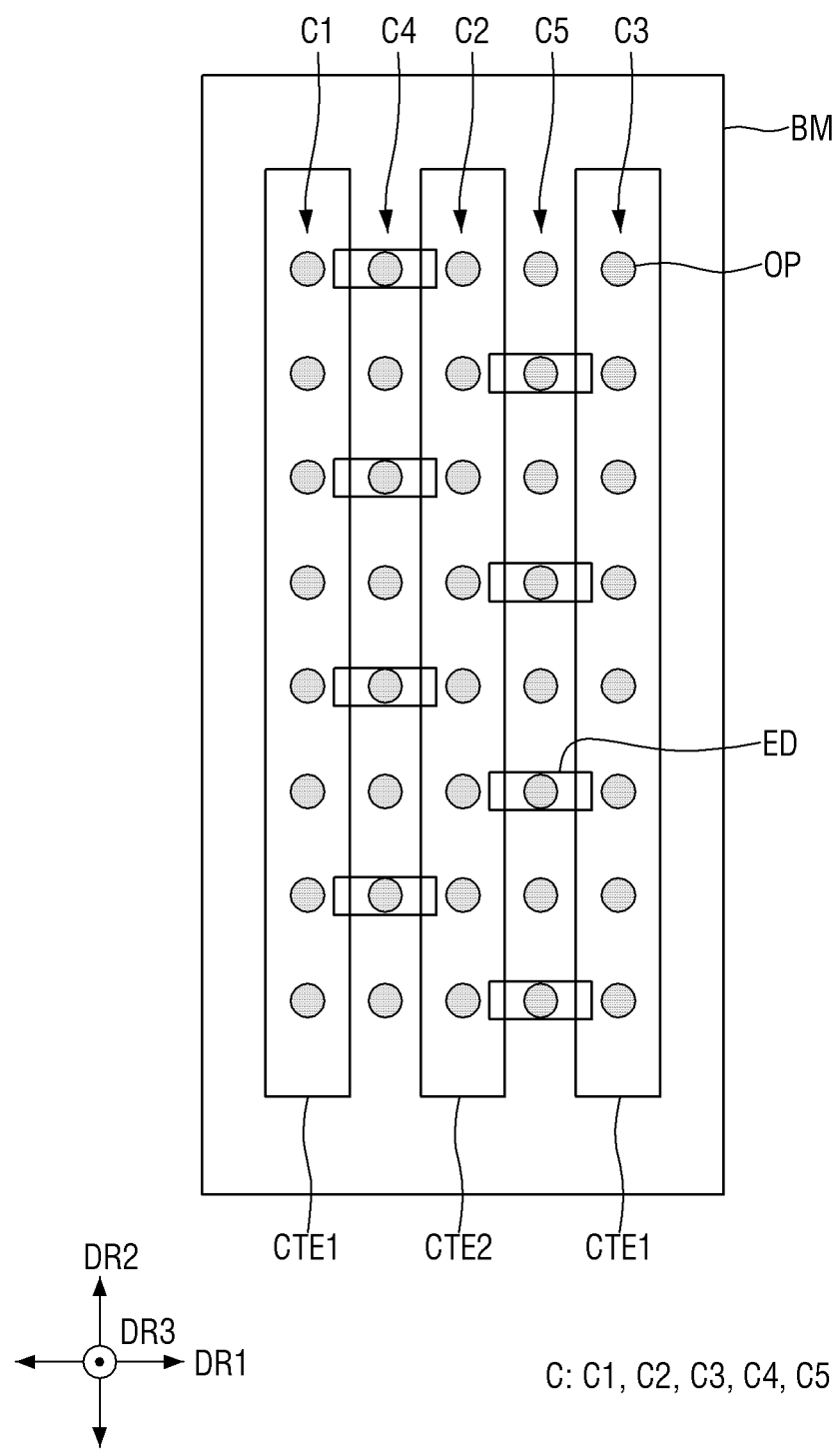
FIG. 8 is a schematic plan view illustrating an opening pattern, a light shielding portion, a light emitting element and a contact electrode of a display device according to one embodiment of the disclosure.

FIG. 8 is a schematic plan view illustrating an opening pattern, a light shielding portion, a light emitting element and a contact electrode of a display device according to an embodiment of the disclosure.

Referring to FIGS. 5 and 8, opening patterns OP may be arranged in a matrix arrangement. The opening patterns OP may be arranged along the first direction DR1 and the second direction DR2. The opening patterns OP constitute columns along the second direction DR2. The columns of opening patterns OP extending in the second direction DR2 may repeatedly be disposed along the first direction DR1. The planar shape of each opening pattern OP may be a circular shape.

As shown in FIG. 8, a first column C1 of opening patterns OP may be disposed on the first contact electrode CTE1 (first contact electrode on the left side) and may overlap the first contact electrode CTE1. A second column C2 of opening patterns OP may be disposed on the second contact electrode CTE2 and may overlap the second contact electrode CTE2. A third column C3 of opening patterns OP may be disposed on the first contact electrode CTE1 (first contact electrode on the right side) and may overlap the first contact electrode CTE1. A fourth column C4 of opening patterns OP may be disposed between the first contact electrode CTE1 (first contact electrode on the left side) and the second contact electrode CTE2. A fifth column C5 of opening patterns OP may be disposed between the first contact electrode CTE1 (first contact electrode on the right side) and the second contact electrode CTE2.

Each of the fourth column C4 of opening patterns OP and the fifth column C5 of opening patterns OP may overlap the light emitting elements ED.

The light emitted from the light emitting elements ED may be emitted through the at least one opening pattern OP, and the planar size of the area (in a plan view) through which the light is emitted may be smaller than the planar size of the light transmitting portion LTU (in a plan view).

The planar shape of the opening patterns OP may be a circular shape, as shown in FIG. 8, but the embodiments are not limited thereto. The planar shape of the opening pattern OP may be an oval shape, a square shape, a triangular shape, or other polygonal shape.

Figure 9:
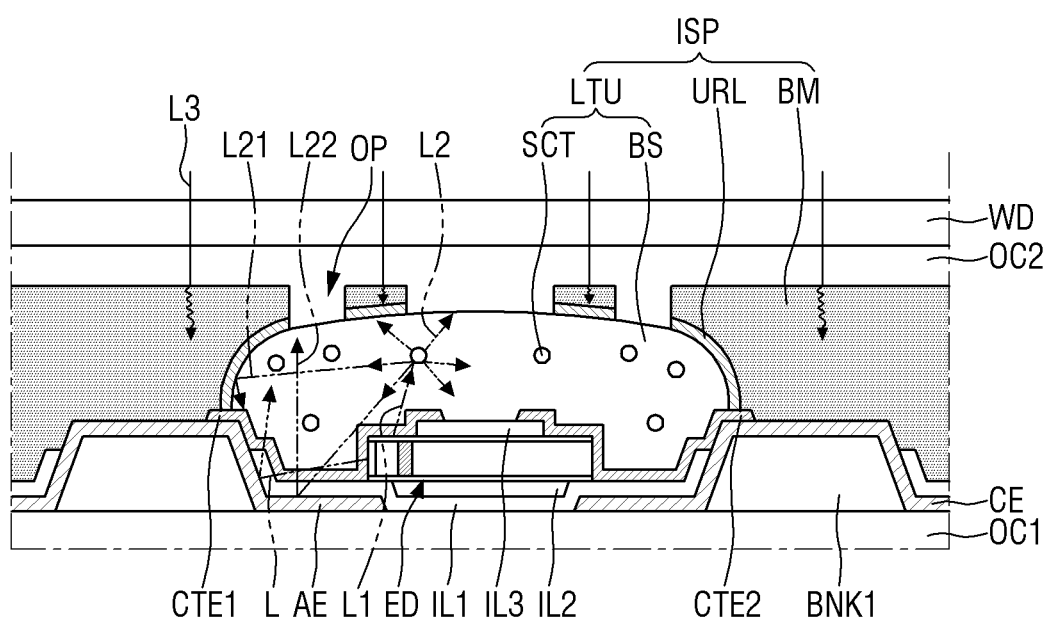
FIG. 9 is a schematic view illustrating that external light reflection and light emission efficiency are improved by the light structure of FIG. 5.

FIG. 9 is a schematic view illustrating improved external light reflection and light emission efficiency of the light structure of FIG. 5.

As shown in FIG. 9, a portion of the light provided from the external light may be absorbed (L3) by the light shielding portion BM, improving external light reflection.

Furthermore, the first light L1 may be emitted from the light emitting element ED. As shown in FIG. 9, the first light L1 emitted from the light emitting element ED may be reflected by the first electrode AE (although not shown, the first light may also be reflected by the second electrode CE), or may be scattered by the scatterer SCT. Although not shown, a portion of the first light L1 may directly be emitted through a light emission area (the opening pattern OP area on the upper surface of the light transmitting portion LTU). The second light L2, which is light scattered by the scatterer SCT from the first light L1, may be emitted through the light emission area or provided to the reflective portion URL (or reflected by the reflective portion URL) (L21), or may be reflected by the first electrode AE at the lower portion (L22).

According to the embodiment, a portion of the light provided from the external light is absorbed (L3) by the light shielding portion BM, whereby external light reflection may be improved. Since the planar size of the area (in a plan view) from which the light is emitted may be smaller than the planar size of the light transmitting portion LTU (in a plan view), the light emission area may be reduced. However, the scattering rate may be enhanced through the scatterer SCT of the light transmitting portion LTU and the scattered light L2 may be re-reflected through the reflective portion URL and the electrodes AE and CE and emitted through the light emission area or induced to be scattered through the scatterer SCT, whereby light emission efficiency may be improved.

Figure 7:
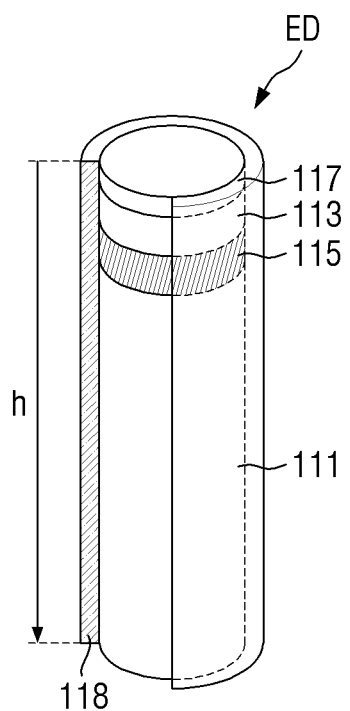
FIG. 7 is a schematic view illustrating a light emitting element according to one embodiment of the disclosure.

FIG. 7 is a view illustrating a light emitting element according to one embodiment of the disclosure.

Referring to FIG. 7, the light emitting element ED may be a light emitting diode. For example, the light emitting element ED may have a size in the micro-meter or nano-meter range, and may be an inorganic light emitting diode that includes an inorganic material. The inorganic light emitting diode may be aligned between two electrodes which face each other during the manufacturing process, by forming an electric field between the two electrodes in a selected direction.

The light emitting element ED may have a shape extending in one direction. The light emitting element ED may be shaped as a rod, a wire, or a tube. The light emitting element ED may include a first semiconductor layer 111, a second semiconductor layer 113, an active layer 115, an electrode layer 117 and an insulating layer 118.

The first semiconductor layer 111 may be an n-type semiconductor. The second semiconductor layer 113 may be disposed on the active layer 115. Each of the first and second semiconductor layers 111 and 113 may be comprised of a single layer, but is not limited thereto.

The active layer 115 may be disposed between the first and second semiconductor layers 111 and 113. The active layer 115 may include a single or multi-quantum well structure material. When the active layer 115 includes a material having multi-quantum well structure, multiple quantum layers and multiple well layers may alternately be deposited.

The light emitted from the active layer 115 may be emitted in a length direction of the light emitting element ED, and may be emitted from both sides. The light emitted from the active layer 115 may not be limited in its directionality.

The electrode layer 117 may be an ohmic contact electrode. In other examples, the electrode layer 117 may be a Schottky contact electrode. The light emitting element ED may include at least one electrode layer 117.

The insulating layer 118 may surround outer surfaces of the plurality of semiconductor layers and electrode layers. The insulating layer 118 may surround an outer surface of the active layer 115, and may extend along the light emitting element ED. The insulating layer 118 may protect the light emitting element ED.

The insulating layer 118 may include materials having insulation properties, such as silicon oxide($SiO_x$), silicon nitride($SiN_x$), silicon oxynitride($SiO_xN_y$), aluminum nitride(AlN), aluminum oxide ($Al_2O_3$), and the like.

The outer surface of the insulating layer 118 may be surface-treated. The light emitting element ED may be disposed on the display device by being dispersed in an ink that is sprayed on the electrode when the display device is manufactured.

Hereinafter, a display device according to an embodiment of the disclosure will be described. In the following embodiment, the same reference elements will be referred to by the same reference numerals as those used above. The description of previously mentioned elements will not be repeated.

Figure 13:
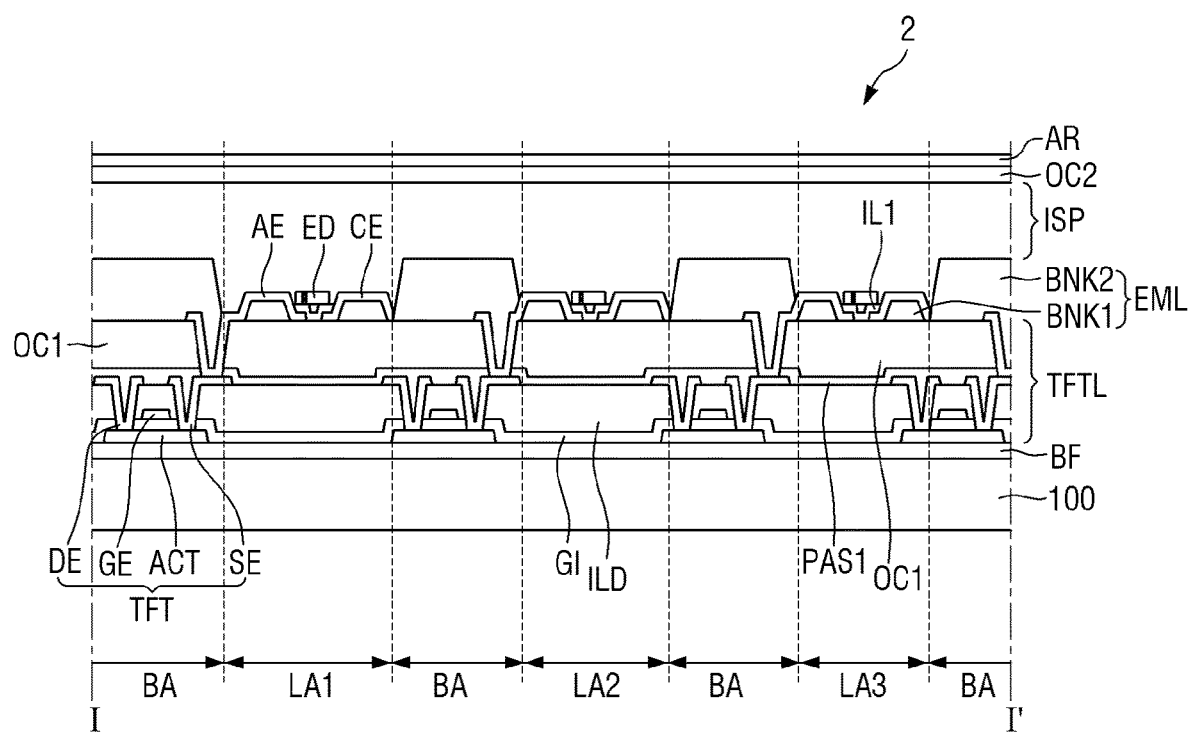
FIG. 13 is a schematic cross-sectional view illustrating a display device according to another embodiment of the disclosure.

FIG. 13 is a cross-sectional view illustrating a display device according to an embodiment of the disclosure.

Referring to FIG. 13, a display device 2 according to another embodiment of the disclosure is different from the display device 1 shown in FIG. 3 in that a window WD may be omitted, and an anti-fingerprint layer AR is disposed on the upper planarization layer OC.

In the display device 2 according to the embodiment, the window WD may be omitted, and an anti-fingerprint layer AR may be disposed on the upper planarization layer OC. The anti-fingerprint layer AR may prevent the user's fingerprints from remaining on the surface of the display device 2. The anti-fingerprint layer AR may be formed directly on the upper planarization layer OC in a coating manner.

Figure 14:
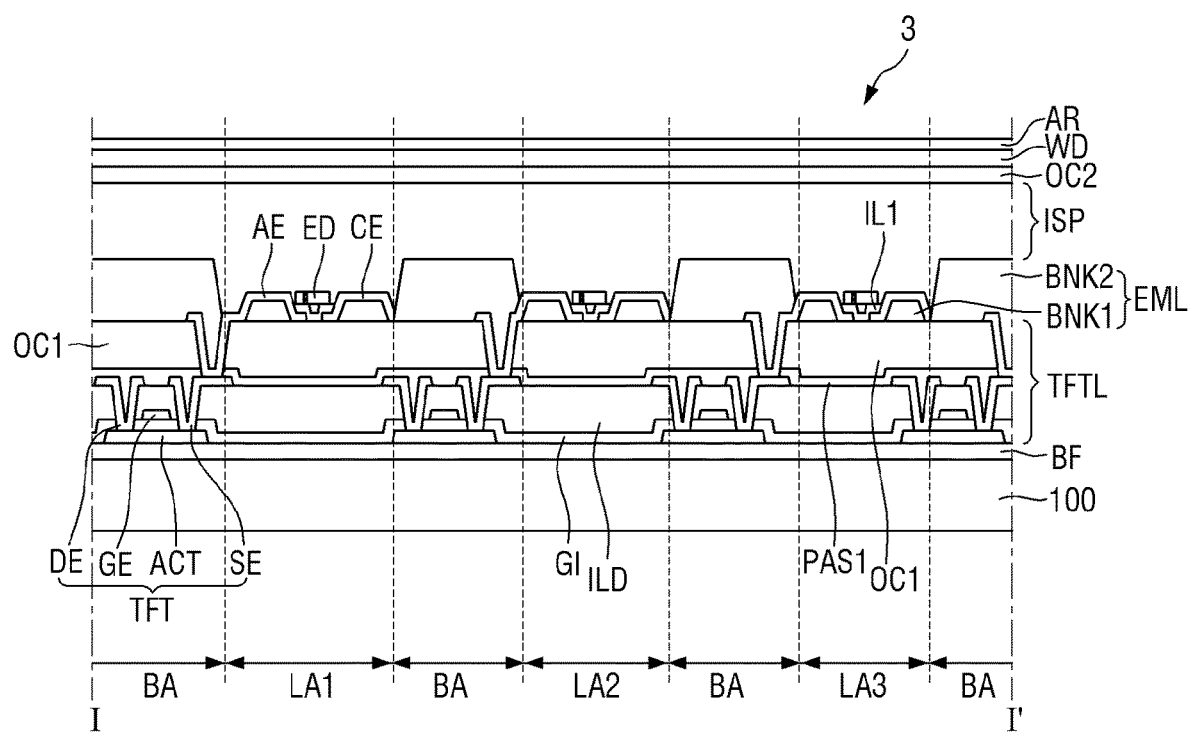
FIG. 14 is a schematic cross-sectional view illustrating a display device according to other embodiment of the disclosure.

FIG. 14 is a cross-sectional view illustrating a display device according to an embodiment of the disclosure.

Referring to FIG. 14, a display device 3 according to other embodiment of the disclosure is different from the display device 1 shown in FIG. 3 in that an anti-fingerprint layer AR may be disposed on the window WD.

In the display device 3 according to the embodiment, the anti-fingerprint layer AR may be disposed on the window WD. The anti-fingerprint layer AR may be formed directly on the window WD.

Figure 15:
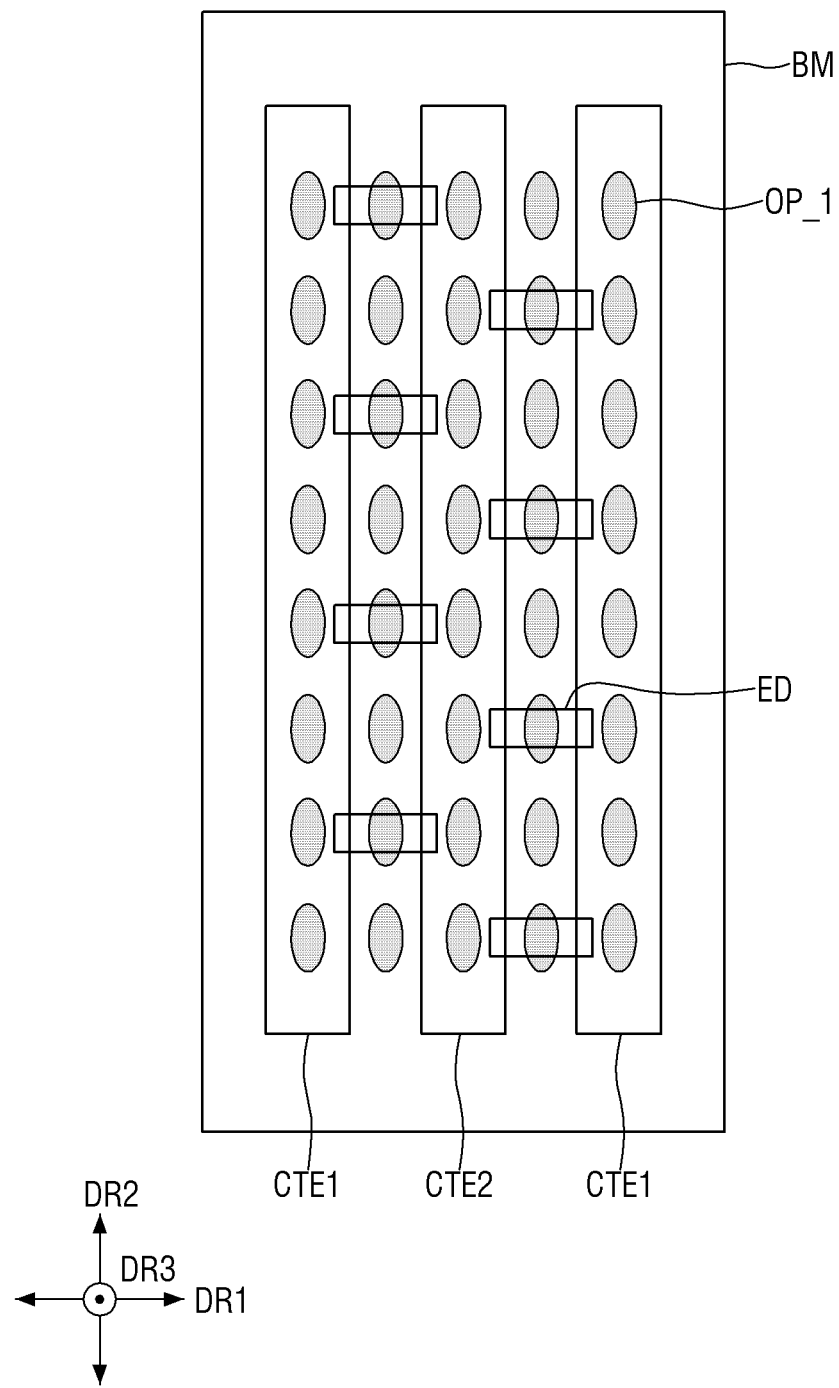
FIG. 15 is a schematic plan view illustrating an opening pattern, a light shielding portion, a light emitting element and a contact electrode of a display device according to another embodiment of the disclosure.
Figure 16:
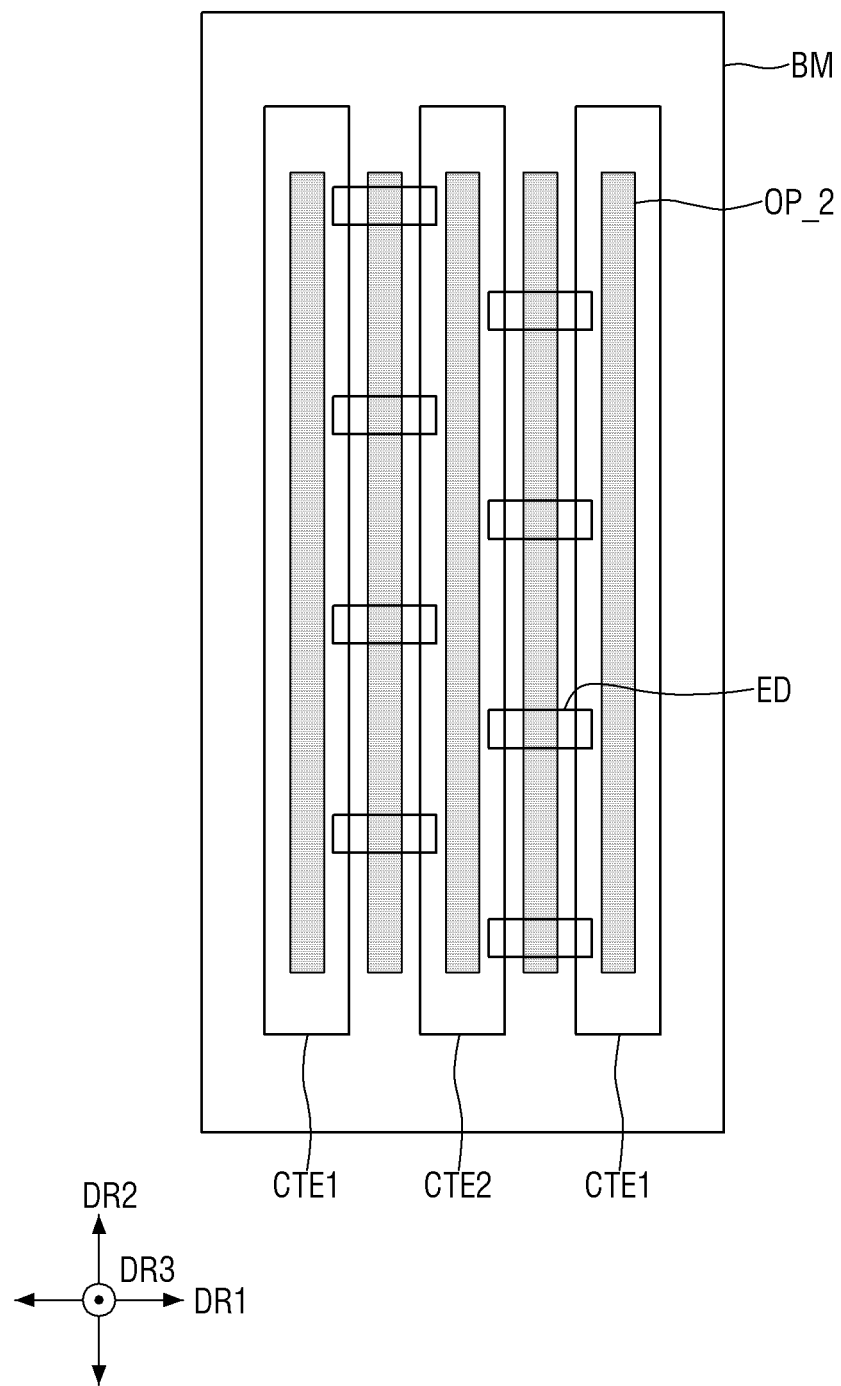
FIG. 16 is a schematic plan view illustrating an opening pattern, a light shielding portion, a light emitting element and a contact electrode of a display device according to still another embodiment of the disclosure.
Figure 17:
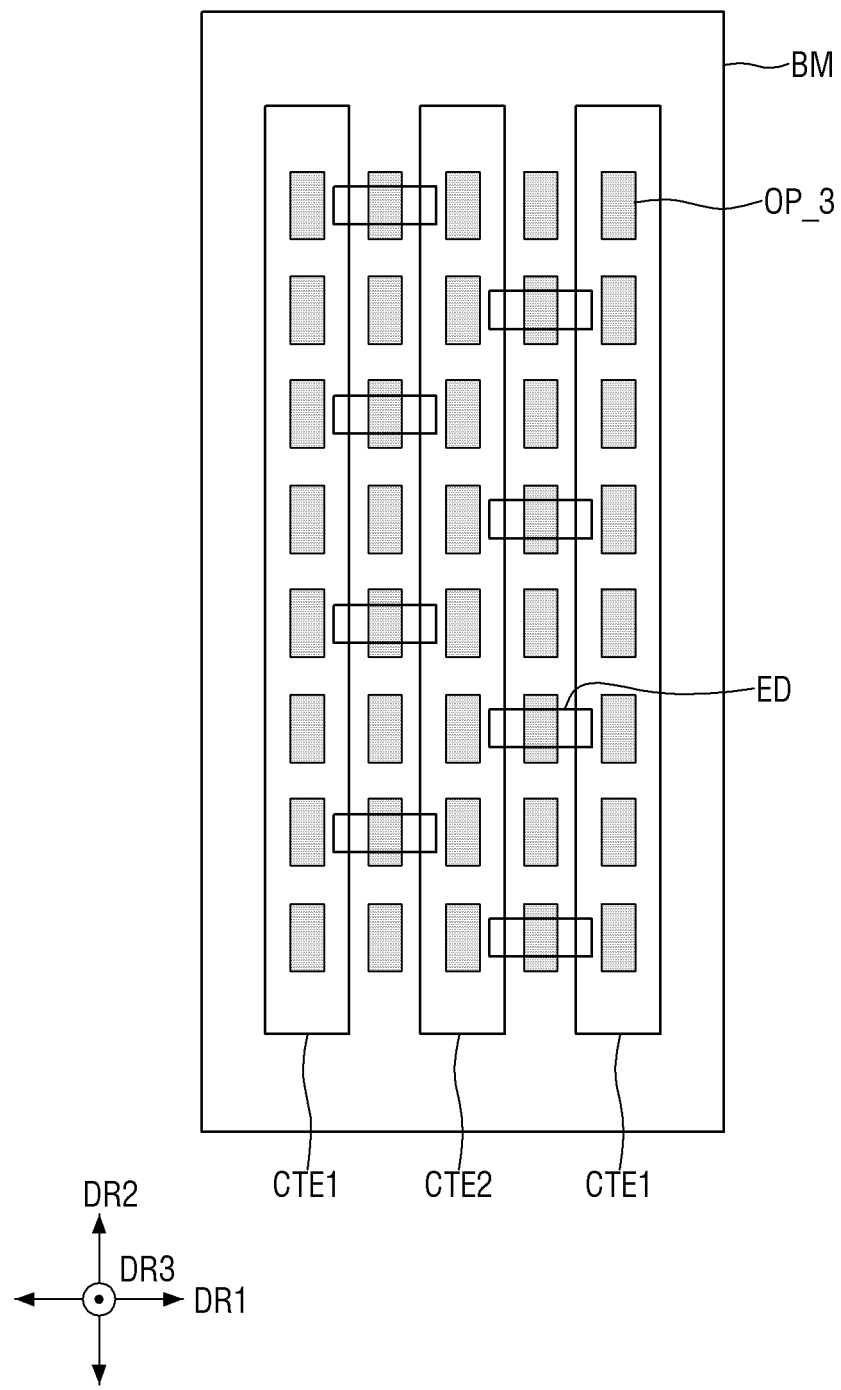
FIG. 17 is a schematic plan view illustrating an opening pattern, a light shielding portion, a light emitting element and a contact electrode of a display device according to further still another embodiment of the disclosure.

FIG. 15 is a schematic plan view illustrating an opening pattern, a light shielding portion, a light emitting element and a contact electrode of a display device according to an embodiment of the disclosure. FIG. 16 is a schematic plan view illustrating another example of an opening pattern, a light shielding portion, a light emitting element and a contact electrode of a display device according to an embodiment of the disclosure. FIG. 17 is a schematic plan view illustrating another example of an opening pattern, a light shielding portion, a light emitting element and a contact electrode of a display device.

Referring to FIG. 15, the oval shape of opening pattern OP_1, according to an embodiment, is different from the shape of opening pattern OP of FIG. 8. The oval planar shape (in a plan view) of the opening pattern OP_1 may have a long axis extended along the second direction DR2 and a short axis extended along the first direction DR1, but is not limited thereto. The oval shape may have a short axis extended along the first direction DR1 and a long axis extended along the second direction DR2.

Referring to FIG. 16, the line shape of opening pattern OP_2, according to an embodiment, is different from the shape of opening pattern OP of FIG. 8. The planar shape (in a plan view) of the opening pattern OP_2 may be a line extending along the second direction DR2. The opening pattern OP_2 having planar shape of a line extending along the second direction DR2 may repeatedly be disposed along the first direction DR1.

Referring to FIG. 17, the quadrangle shape of opening pattern OP_3, according to an embodiment is different from the shape of opening pattern OP of FIG. 8. The quadrangle planar shape (in a plan view) of the opening pattern OP_3 may be a rectangular shape or a square shape. For example, the shape of the opening pattern OP_3 may be a rectangular shape in a plan view. The rectangular shape may have a long side extending along the second direction DR2 and a short side extending along the first direction DR1, but is not limited thereto. The long side of the rectangular shape may extend along the first direction DR1 and the short side may extend along the second direction DR2.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
a first electrode and a second electrode disposed on a base substrate and spaced apart from each other, the second electrode facing the first electrode;
light emitting elements disposed between the first electrode and the second electrode; and
a light structure disposed on the light emitting elements, wherein
the light structure includes:
a light transmitting portion disposed on the light emitting elements; and
a light shielding portion including at least one opening pattern,
the light shielding portion is disposed on the light transmitting portion, and
the light shielding portion overlaps at least one of the light emitting elements in a view perpendicular to the base substrate.

2. The display device of claim 1, wherein
the light transmitting portion includes:
a base resin; and
a scatterer dispersed in the base resin, and
the scatterer has a refractive index different from a refractive index of the base resin.

3. The display device of claim 2, wherein the scatterer includes light scattering particles.

4. The display device of claim 3, wherein a content of the light scattering particles in the light transmitting portion is in a range of about 2% to about 3%.

5. The display device of claim 3, wherein the light scattering particles include titanium oxide ($TiO_2$) or silicon oxide ($SiO_2$).

6. The display device of claim 1, wherein the light transmitting portion is disposed on each of the light emitting elements.

7. The display device of claim 1, further comprising:
banks that are spaced apart from each other and disposed on the base substrate,
wherein the first electrode and the second electrode are disposed on the banks and are spaced apart from each other.

8. The display device of claim 7, further comprising:
a first insulating layer disposed on the first electrode and the second electrode between the banks,
wherein the light emitting elements are disposed on the first insulating layer.

9. The display device of claim 8, further comprising:
a contact electrode disposed on the first insulating layer, and electrically contacting the light emitting elements, wherein
the contact electrode includes:
a first contact electrode that electrically contacts the first electrode and an end of at least one of the light emitting elements; and
a second contact electrode that electrically contacts the second electrode and another end of the at least one of the light emitting elements.

10. The display device of claim 9, wherein the light transmitting portion directly contacts the contact electrode.

11. A display device comprising:
a first electrode and a second electrode disposed on a base substrate and spaced apart from each other, the second electrode facing the first electrode;
light emitting elements disposed between the first electrode and the second electrode; and
a light structure disposed on the light emitting elements, wherein
the light structure includes:
a light transmitting portion disposed on the light emitting elements; and
a light shielding portion including at least one opening pattern,
the light shielding portion is disposed on the light transmitting portion, and
the light structure further includes a reflective portion disposed between the light shielding portion and the light transmitting portion.

12. The display device of claim 11, wherein the reflective portion includes at least one opening pattern.

13. The display device of claim 12, wherein the at least one opening pattern of the reflective portion and the at least one opening pattern of the light shielding portion are formed at the same time.

14. The display device of claim 11, wherein the reflective portion, the first electrode, and the second electrode include a reflective electrode.

15. The display device of claim 12, wherein the at least one opening pattern of the light shielding portion and the at least one opening pattern of the reflective portion overlap the light transmitting portion in a thickness direction of the display device.

16. The display device of claim 1, wherein at least one of the light emitting elements overlaps the at least one opening pattern of the light shielding portion in the view.

17. The display device of claim 1, wherein the light shielding portion includes at least one of chromium oxide (CrOx), chromium-chromium oxide (Cr/CrOx) compound, molybdenum oxide (MoOx), a carbon pigment and a Red-Green-Blue (RGB) primary color pigment.

18. A display device comprising:
- a first electrode and a second electrode disposed on a base substrate and spaced apart from each other, the second electrode facing the first electrode;
- light emitting elements disposed between the first electrode and the second electrode and emitting light;
- a light transmitting portion disposed on the light emitting elements;
- a light shielding portion disposed on the light transmitting portion; and
- a reflective portion disposed between the light transmitting portion and the light shielding portion, wherein the light transmitting portion includes:
- a base resin; and
- a scatterer dispersed in the base resin, the scatterer includes light scattering particles, at least one opening pattern passes through the light shielding portion and the reflective portion, and is formed in the light shielding portion and the reflective portion, the light emitting elements emit light through the at least one opening pattern, and a size of an area in a plan view from which the light is emitted is smaller than a size of an area in a plan view of the light transmitting portion.

19. The display device of claim 18, wherein the reflective portion, the first electrode, and the second electrode include a reflective electrode, and the reflective portion, the first electrode, and the second electrode reflect the light emitted from the light emitting elements.

20. The display device of claim 18, wherein the light scattering particles scatter the light emitted from the light emitting elements.

* * * * *